United States Patent
Kim et al.

(10) Patent No.: US 7,498,267 B2
(45) Date of Patent: Mar. 3, 2009

(54) METHOD FOR FORMING SEMICONDUCTOR MEMORY CAPACITOR WITHOUT CELL-TO-CELL BRIDGES

(75) Inventors: Gyu Hyun Kim, Kyoungki-do (KR); Yong Soo Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 14 days.

(21) Appl. No.: 11/776,750

(22) Filed: Jul. 12, 2007

(65) Prior Publication Data
US 2008/0102594 A1 May 1, 2008

(30) Foreign Application Priority Data
Oct. 31, 2006 (KR) .................... 10-2006-0106909

(51) Int. Cl.
*H01L 21/302* (2006.01)
*H01L 21/461* (2006.01)

(52) U.S. Cl. ................ 438/706; 438/905; 257/E21.17; 257/E21.227; 257/E21.229; 257/E21.231; 257/E21.267

(58) Field of Classification Search ................ 438/238, 438/311, 513, 680, 706, 740, 789, 790, 793, 438/794, 905, 906
See application file for complete search history.

(56) References Cited

U.S. PATENT DOCUMENTS

| 2004/0241520 A1* | 12/2004 | Ha et al. ................ 429/33 |
| 2005/0252526 A1* | 11/2005 | Ogawa et al. ............ 134/2 |
| 2007/0231655 A1* | 10/2007 | Ha et al. ................ 429/33 |

FOREIGN PATENT DOCUMENTS

| KR | 1019990085621 | 12/1999 |
| KR | 1020060020825 | 3/2006 |

* cited by examiner

*Primary Examiner*—David Nhu
(74) *Attorney, Agent, or Firm*—Ladas & Parry, LLP

(57) ABSTRACT

A capacitor is formed by forming a mold insulating layer with a plurality of storage node holes over a semiconductor substrate. A metal storage node is formed on the surface of each of the storage node holes in the mold insulating layer. The mold insulating layer is removed by performing the following steps: loading the semiconductor substrate with the storage node in the chamber for in-situ cleaning, rinsing, and drying processes; removing the mold insulating layer by an etchant in the chamber; then rinsing the semiconductor substrate by introducing deionized water into the chamber while discharging the etchant out of the chamber; finally rinsing the rinsed semiconductor substrate with a mixed solution of the deionized water and organic solvent; drying the finally rinsed semiconductor substrate by IPA vapor in the chamber while discharging the mixed solution of the deionized water and organic solvent out of the chamber.

19 Claims, 9 Drawing Sheets first rinse second rinse final rinse

METHOD FOR FORMING SEMICONDUCTOR MEMORY CAPACITOR WITHOUT CELL-TO-CELL BRIDGES

CROSS-REFERENCE TO RELATED APPLICATIONS

The present application claims priority to Korean patent application number 10-2006-0106909 filed on Oct. 31, 2006, which is incorporated herein by reference in its entirety.

BACKGROUND OF THE INVENTION

The present invention relates to a method for forming a capacitor, and more particularly to a method for forming a capacitor capable of preventing the generation of cell-to-cell bridges upon the formation of cylindrical metal storage nodes.

A capacitor has a structure in which a dielectric layer is interposed between a storage node and a plate node. The capacitance is proportional to the surface area of the node and the dielectric constant of the dielectric layer and inversely proportional to the distance between the nodes, i.e., the thickness of the dielectric layer. Therefore, in order to achieve high capacitance, it is necessary to use a dielectric layer having a high dielectric constant and/or enlarge the surface area of the node and/or reduce the distance between the nodes.

A concave-type silicon-insulator-silicon (SIS) capacitor which employs poly-silicon as node materials has been conventionally used. However, such a concave-type SIS capacitor has difficulties in decreasing the surface area and increasing the height of the capacitor due to reduction in the cell size, which limits the SIS capacitor's ability to secure the capacitance. Further, although research concerning dielectric layer having a larger dielectric constant has been actively conducted in a variety of ways with regard to terms of structure and method, leakage current increases the difficulty of using a dielectric layer having a larger dielectric constant.

Therefore, a capacitor has been recently developed which employs metals of higher work function as the node materials. Moreover, the capacitor structure is changed from concave to cylindrical, since the smaller size of the storage node limits the extent to which the height of the capacitor may be increased.

On the other hand, when forming the cylindrical metal-insulator-metal (MIM) capacitor using the metal node, a mold insulating layer of oxide layer must be removed after forming the cylindrical metal storage node. For these purposes, a cleaning process using a Buffered Oxide Etchant (BOE) was conventionally implemented.

Hereinafter, the conventional cleaning process which removes the mold insulating layer upon forming the cylindrical MIM capacitor will be briefly described.

First, in order to remove the mold insulating layer, the cleaning process is performed by immersing a semiconductor substrate with the metal storage node in the BOE bath containing BOE solution layer. The resulting substrate with the mold insulating layer being removed is moved into a rinse bath, where it is rinsed with deionized water in order to remove BOE chemical residues. Subsequently, the rinsed resulting substrate is moved into another rinse bath, where it is finally rinsed with the deionized water in order to remove any particles. Then, the final rinsed substrate is moved into a dryer, where it is dried. The drying process is performed using an isopropyl alcohol (IPA) vapor dryer, a Marangoni dryer, or an IPA vapor spray dryer.

In the prior art described above, however, the substrate is exposed to the atmosphere each time the substrate is moved to different bathes (i.e., chambers) for performing the cleaning process, rinse process, resulting rinse process, and drying process, and these exposures lead to certain portions of the substrate being dried out. As a result, watermarks are generated between neighboring cylindrical metal storage nodes. Such watermarks may be generated even when the water in the substrate is not completely substituted into the IPA during the drying process.

FIG. 1 shows examples of such watermarks 120 generated upon the formation of the cylindrical metal storage node. It can be noted from FIG. 1 that the watermarks 120 are generated between the neighboring cylindrical metal storage nodes 110.

However, if watermarks are generated between the cylindrical metal storage nodes, the watermarks may apply surface tension to the side walls of the neighboring cylindrical metal storage nodes such that cell-to-cell leaning is caused, thereby creating cell-to-cell bridges as shown in FIG. 2. It is impossible to repair such cell-to-cell bridges, which reduce the manufacturing yield of the semiconductor device.

SUMMARY OF THE INVENTION

Embodiments of the present invention are directed to a method for forming a capacitor which can prevent the formation of watermarks between metal storage nodes upon the formation of cylindrical metal storage nodes.

Further, embodiments of the present invention are directed to a method for forming a capacitor which can prevent the formation of cell-to-cell bridges by preventing formation of watermarks between the metal storage nodes.

Also, embodiments of the present invention are directed to a method for forming a capacitor, which can prevent reduction in manufacturing yield by preventing the formation of cell-to-cell bridges.

In one embodiment, a method for forming a capacitor comprises steps of forming a mold insulating layer with a plurality of storage node holes over a semiconductor substrate; forming a storage node on the surface of each of the plurality of storage node holes in the mold insulating layer; and removing the mold insulating layer, wherein the removal step comprises steps of loading the semiconductor substrate with the storage node in the chamber where a cleaning process, rinse process and drying process are performed in an in-situ manner; removing the mold insulating layer by introducing an etchant into the chamber; rinsing the semiconductor substrate with the mold insulating layer being removed by introducing a deionized water into the chamber while discharging the etchant out of the chamber; finally rinsing the rinsed semiconductor substrate with a mixed solution of the deionized water and an organic solvent; drying the finally rinsed semiconductor substrate by introducing an IPA vapor into the chamber while discharging the mixed solution of the deionized water and the organic solvent out of the chamber; and unloading the dried semiconductor substrate.

The storage node made of metal.

The etchant for removing the mold insulating layer is used with a BOE solution or a diluted HF solution and the diluted HF solution has a ratio of 49% $HF:H_2O$ and a volume ratio of 1:1~1:50.

The rinsing step of the semiconductor substrate comprises steps of first rinsing with only the deionized water introduced into the chamber; and second, rinsing with the deionized water and $O_3$ by introducing $O_3$ into the chamber.

The second rinsing step is performed with $O_3$ maintained at a concentration of 5~200 ppm for 1~10 minutes.

The final rinsing step is performed using a mixed solution of any one of an IPA, a methanol or an ethanol as the organic solvent and the deionized water. Preferably, the IPA is contained at a volume ratio of 1~99%, and the final rinsing step is performed by controlling the temperature of the mixed solution of the deionized water and the IPA at 23~70° C.

The drying step of the semiconductor substrate is performed by introducing a hot $N_2$ gas as a carrier gas for the IPA vapor into the chamber, and the hot $N_2$ gas has a temperature of 50~200° C. The IPA has vapor contents of 20~90% in the mixed gas of the IPA and the hot $N_2$ gas.

The chamber is used with a FRD (dHF & Rinsing Dryer) type dryer in which the cleaning process, rinse process and drying process are performed in an in-situ manner.

The FRD type dryer comprises the chamber in which the cleaning process, rinse process and drying process are performed; a cover covering the chamber; a deionized water supply bath, an etchant supply bath, an $O_3$ generator and an organic solvent bath connected to the chamber for providing the deionized water, the etchant, the $O_3$ and the organic solvent, respectively; and an IPA vapor generator connected to the chamber for providing the IPA vapor.

The IPA vapor generator is connected to an upper portion of the cover.

The FRD type dryer further comprises a hot $N_2$ gas supplier connected to the IPA vapor generator for providing the hot $N_2$ gas.

The FRD type dryer further comprises a supply port connected to the lower side portion of the chamber for introducing the deionized water, etchant, $O_3$ and organic solvent into the chamber; and a drain connected to the bottom portion of the chamber for discharging the solutions introduced into the chamber out of the chamber

DESCRIPTION OF SPECIFIC EMBODIMENTS

A cleaning process, rinse process, and drying process for removing a mold insulating layer according to an embodiment of the present invention are performed in an in-situ manner within the same chamber and do not require the substrate to be moved. In this case, since the substrate is not exposed to the atmosphere at the time of the cleaning process, rinse process, and drying process, it is possible to prevent the residual water in the substrate from drying, thereby preventing watermarks from being formed and cell-to-cell bridges from being generated between the metal storage nodes.

Further, in an embodiment of the present invention, the final rinse process preceded by the drying process is performed using a mixed solution of deionized water and an organic solvent rather than solely deionized water. In this case, since surface tension of the residual water in the substrate is reduced by the organic solvent, the subsequent drying process can be performed when the surface tension of the water is minimal. Therefore, all of the water on the substrate can be substituted into the isopropyl alcohol (IPA), whereby the generation of watermarks between the metal storage nodes is prevented and thus cell-to-cell bridges are not created.

Therefore, according to an embodiment of the present invention, it is possible to prevent watermarks from being generated between the metal storage nodes by performing in-situ processes and using a mixed solution of the deionized water and organic solvent in the final rinse process. As a result, the present invention makes it possible to prevent cell-to-cell leaning and cell-to-cell bridges from being caused by watermarks, and thus prevents a reduction in the manufacturing yield of the semiconductor device.

FIG. 3A through 3F are cross-sectional views illustrating the process steps of a method for manufacturing a cylindrical MIM capacitor according to an embodiment of the present invention.

Figure 1:
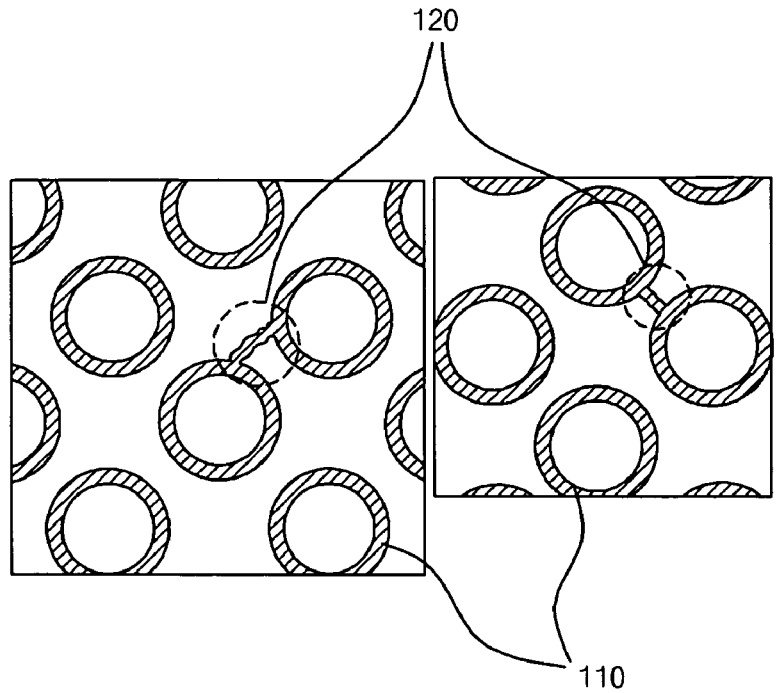
FIG. 1 shows examples of watermarks generated upon the formation of cylindrical metal storage nodes.
Figure 2:
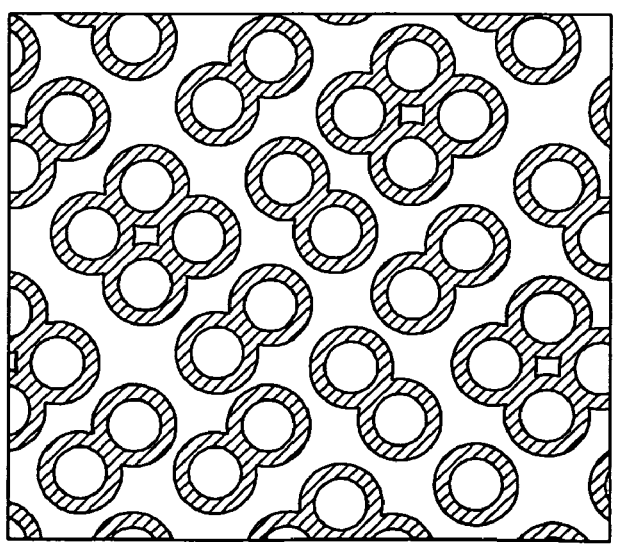
FIG. 2 shows examples of cell-to-cell leaning caused by the generation of watermarks upon the formation of prior cylindrical metal storage nodes.
Figure 3A:
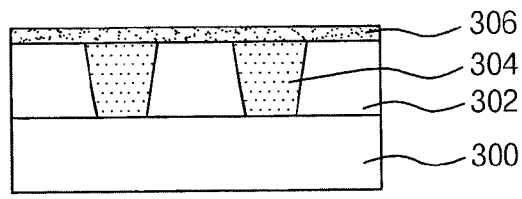
FIGS. 3A through 3F are cross-sectional views for showing the process steps of a method for forming a cylindrical MIM capacitor in accordance with another embodiment of the present invention.

Referring to FIG. 3A, an interlayer insulating layer 302 is deposited over a semiconductor substrate 300, and then a contact hole is formed by etching the interlayer insulating layer 302. A storage node contact plug 304 is formed by filling the contact hole with poly-silicon layer. An etch-stop nitrate layer 306 having a thickness of approximately 800Å is formed on the interlayer insulating layer 302 including the storage node contact plug 304.

The etch-stop nitrate layer 306 is formed at a temperature of approximately 710° C. using $N_2$ gas, $NH_3$ gas, and DCS (Dichlorosilane; $SiH_2Cl_2$) gas as a source gas in a furnace. The etch-stop nitrate layer 306 serves to protect against etch attack by the lower structure of the storage node, i.e., the interlayer insulating layer 302 and the storage node contact plug 304 in a subsequent dip-out process for removing the mold insulating layer.

Figure 3B:
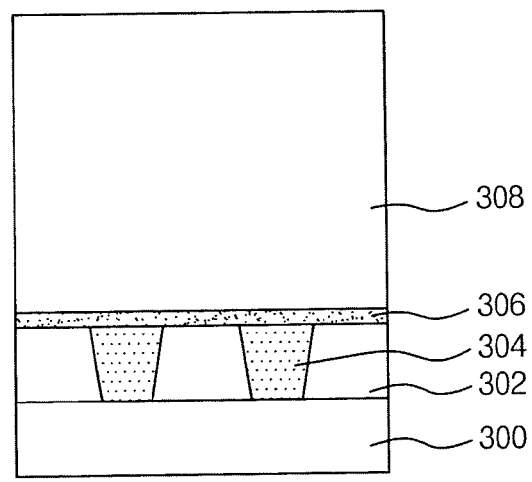
Figure 3C:
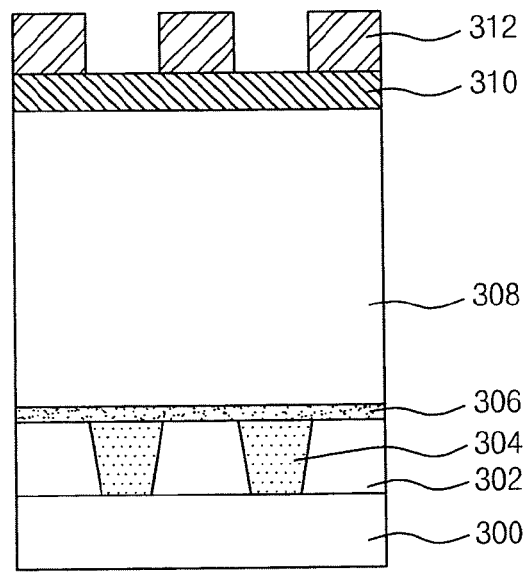

Referring to FIG. 3B, the mold insulating layer 308 serving as a mold for the cylindrical storage node is formed on the etch-stop nitrate layer 306. The mold insulating layer 308 is formed as a laminated layer having a PE-TEOS layer, an $O_3$-TEOS layer, an $O_3$-USG layer, a PSG layer, and a PE-TEOS layer or a laminated layer having a BPSG layer and a PE-TEOS layer. Referring to FIG. 3C, a hard mask layer 310 and a mask pattern 312 defining the storage node formation area are sequentially formed on the mold insulating layer 308. The hard mask layer 310 is typically formed with poly-silicon in order to compensate for difficulties in pattern formation, such as collapses occurring at side surfaces of the pattern, since sufficient selectivity cannot be ensured by solely the mask pattern 312 in the subsequent etch process.

Figure 3D:
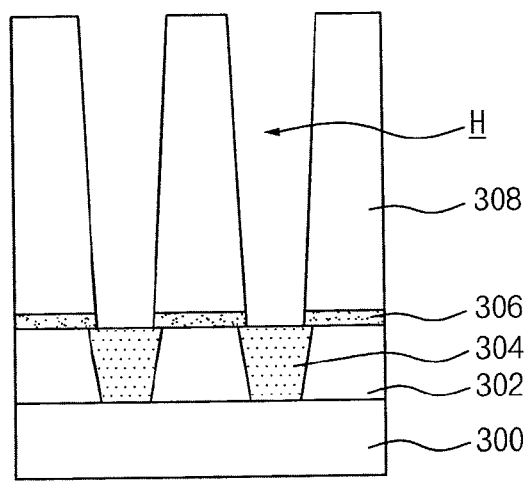

Referring to FIG. 3D, exposed portions of the hard mask layer 310 are etched by HBr, $Cl_2$, and $O_2$ gases using the mask pattern 312 as an etch mask, and then the mask pattern is removed. The mold insulating layer 308 is etched using the etched hard mask layer 310 as etch mask and using etch selectivity between the oxide layer and the nitrate layer. The mold insulating layer 308 is etched using $C_4F_6$, $O_2$ and $CF_4$ gas. The hard mask layer 310 is removed via the etch process using $C_2F_6$ and $O_2$ gas. The portions of the etch-stop nitrate layer 306 exposed by etching the mold insulating layer 308 are removed, whereby storage node holes H are formed to expose the storage node contact plug 304.

Figure 3E:
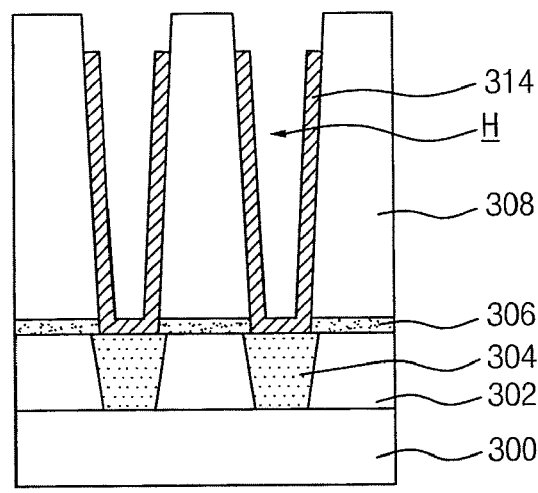

Referring to FIG. 3E, a TiN layer having a thickness of approximately 300 Å is deposited as a storage node conductive layer on surfaces of the hole H and the mold insulating layer 308. The TiN layer is deposited at a temperature of 580° C. via Chemical Vapor Deposition (CVD) using $TiCl_4$ gas. The TiN layer formed on the mold insulating layer 308 is selectively removed by a plasma-etching process using $Cl_2$ and Ar gas as etching gas, whereby the cylindrical metal storage node 314 contacted with the exposed storage node contact plug 304 is formed on the surfaces of the hole H. The storage node 314 can be formed with a W layer or a Ru layer instead of the TiN layer.

Figure 3F:
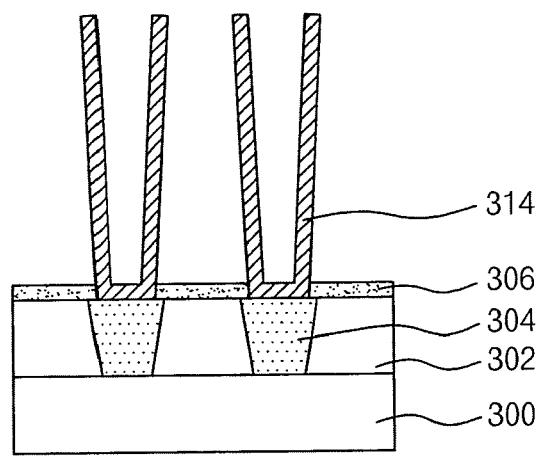

Referring to FIG. 3F, the mold insulating layer used as the mold for forming the cylindrical metal storage node 314 is removed using a FRD (HF rinse dryer) type dryer in which the cleaning process, the rinse process and the drying process are performed in an in-situ manner within the same equipment, to finish forming the cylindrical metal storage node 314.

Although not shown, the dielectric layer and the metal plate node are sequentially formed on the cylindrical metal storage node 314, thereby forming the cylindrical MIM capacitor.

Figure 4:
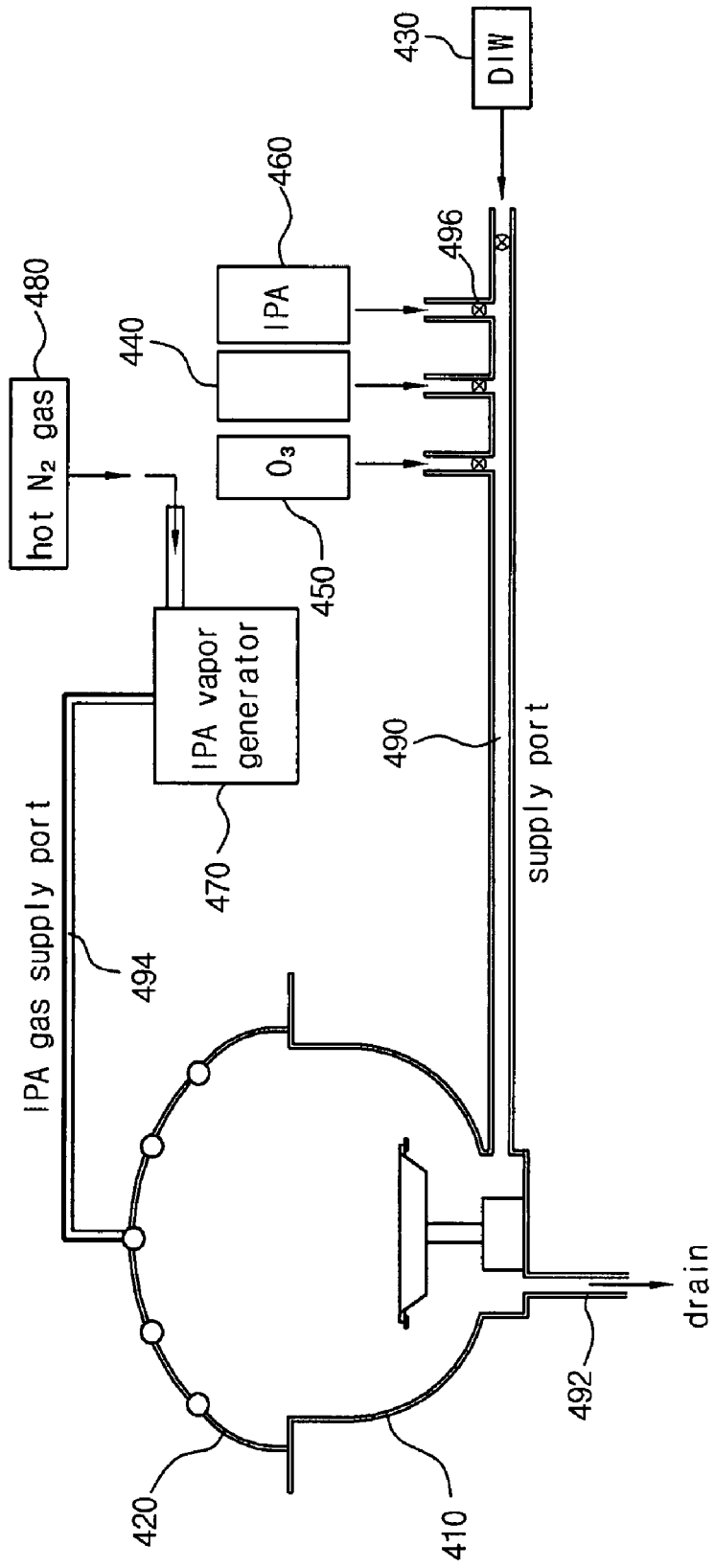
FIG. 4 is a cross-sectional view for showing a HF rinse dryer (FRD) type dryer.

FIG. 4 is a cross-sectional view illustrating the FRD type dryer used in the method for forming the capacitor according to an embodiment of the present invention.

The FRD type dryer 400 according to an embodiment of the present invention can allow the cleaning process, the rinse process, and the drying process to be performed in an in-situ manner within the same equipment. As shown in FIG. 4, the FRD type dryer 400 includes a chamber 410 in which the cleaning process, rinse process and drying process are performed, a cover 420 covering the chamber 410, a deionized water supply bath 430 providing the deionized water, etchant, $O_3$ and the organic solvent, respectively, an etchant supply bath 440, an $O_3$ generator 450, and an organic solvent bath 460, and an iso-propylene alcohol (IPA) vapor generator 470 which is connected to the chamber 410 for providing the IPA vapor. The FRD type dryer 400 according to an embodiment of the present invention further includes a hot $N_2$ gas supplier 480 which is connected to the IPA vapor generator 470 for providing a hot $N_2$ gas.

The lower side portion of the chamber 410 is connected to a supply port 490 through which deionized water, etchant, $O_3$ and organic solvent are introduced into the chamber 410. The bottom of the chamber 410 is connected to a drain 492 through which the solutions and the gas introduced into the chamber 410 are discharged out of the chamber 410. The IPA vapor generator 470 is connected to an upper portion of the cover 420 by the IPA vapor supply port 494.

In order to remove the mold insulating layer 308 using the FRD type dryer 400, the cleaning process for etching the insulating layer using a diluted HF solution within the chamber, the rinse process for rinsing the cleaned substrate, and the drying process for drying the rinsed substrate are all performed in an in-situ manner. Therefore, the substrate is not exposed to the atmosphere during the processes.

More specifically, if the semiconductor substrate with the metal storage node is carried into the chamber 410, the etchant, deionized water, $O_3$, organic solvent and IPA vapor containing the hot $N_2$ gas are sequentially introduced into the chamber 410 via the supply port 490 connected to the bottom side portion of the chamber 410, whenever the cleaning process, rinse process and drying process are performed.

At this time, the etchant, deionized water, $O_3$, and organic solvent are introduced into the chamber 410 via the supply port 490 in accordance with the on/off status of the valve 496 connected to the supply port 490, and the IPA vapor is introduced into the chamber 410 via the IPA vapor supply port 494 above the chamber 410. Hot $N_2$ gas at a temperature of 80~200° C. is introduced into the chamber 410 as a carrier gas together with the IPA vapor.

Further, whenever each process is finished, the solution used in the prior process is discharged out of the chamber 410 via the drain 492 located at the bottom of the chamber 410. Moreover, new solution necessary for the next process is introduced into the chamber 410 via the supply port 490.

Therefore, since the present invention allows the cleaning process, rinse process and drying process for removing the mold insulating layer to be performed in an in-situ manner within the chamber without a need to move the semiconductor substrate, it is possible to prevent watermarks from being formed between the metal storage nodes, thereby preventing the generation of cell-to-cell leaning and cell-to-cell bridges, which are caused by watermarks.

Hereinafter, referring to FIGS. 5A through 5G, the cleaning process, rinse process and drying process will be described specifically using the above-mentioned FRD type dryer.

Figure 5A:
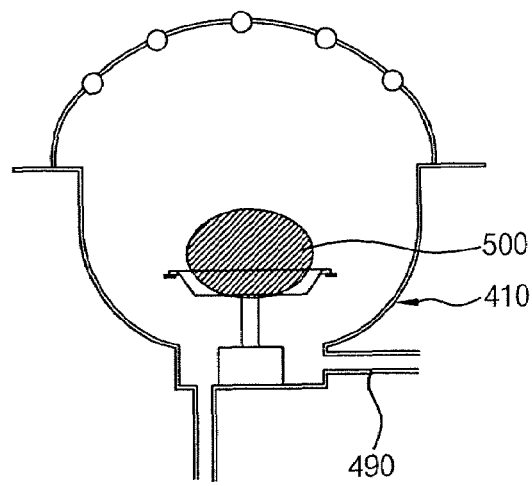
FIGS. 5A through 5G are diagrams illustrating the cleaning process, rinse process and drying process in the method for forming a capacitor in accordance with another embodiment of the present invention.

Referring to FIG. 5A, the semiconductor substrate 500 with the metal storage node is loaded into the chamber 410 of the FRD type dryer.

Figure 5B:
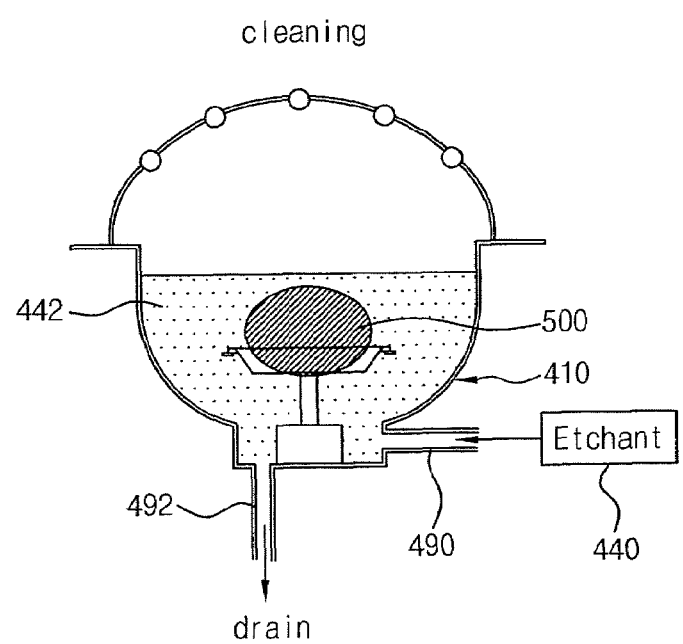

Referring to FIG. 5B, the etchant 442 is introduced from the etchant supply bath 440 into the chamber 410 via the supply port 490 connected to a lower side portion of the chamber 410 such that the cleaning process for removing the mold insulating layer may be performed. It is preferable to employ the BOE solution or the diluted HF solution as the etchant and to use a diluted HF solution of 49% (HF):51% ($H_2O$) with HF:$H_2O$ volume ratio of 1:1~1:50.

Figure 5C:
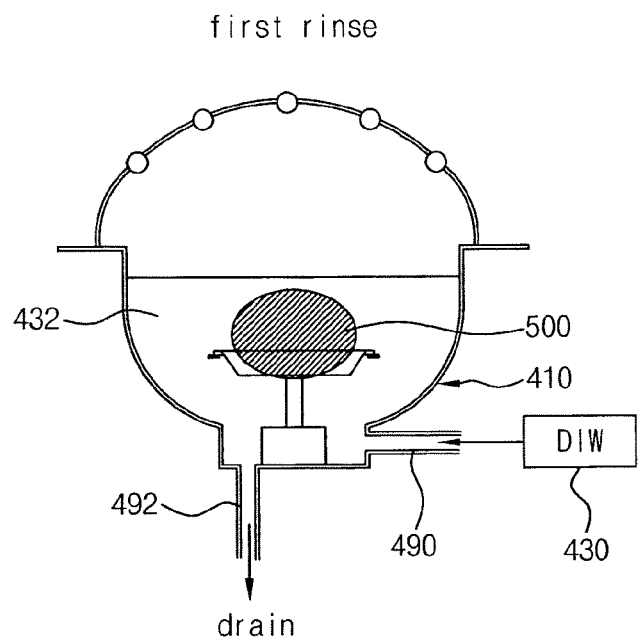

Referring to FIG. 5C, the etchant is discharged out of the chamber 410 via the drain 492 located at the bottom of the chamber 410, and deionized water 432 is subsequently introduced from the deionized water supply bath 430 into the chamber 410 via the supply port 490 such that the semiconductor substrate 500 with the mold insulating layer being removed from it is first rinsed.

Figure 5D:
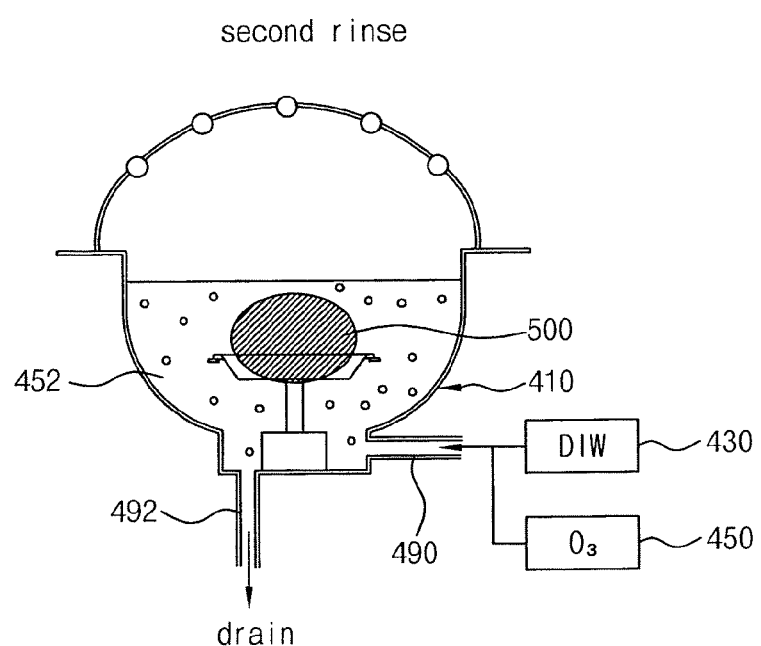

Referring to FIG. 5D, $O_3$ is introduced into the chamber with the deionized water via the supply port 490 connected to the chamber 410 such that the first rinsed semiconductor substrate 500 may be rinsed a second time with the deionized water and $O_3$ solution 452. The deionized water and $O_3$ solution 452 maintains an $O_3$ concentration of 5~200 ppm. The second rinse process using the deionized water and $O_3$ solution 452 is performed for 1~10 minutes.

Figure 5E:
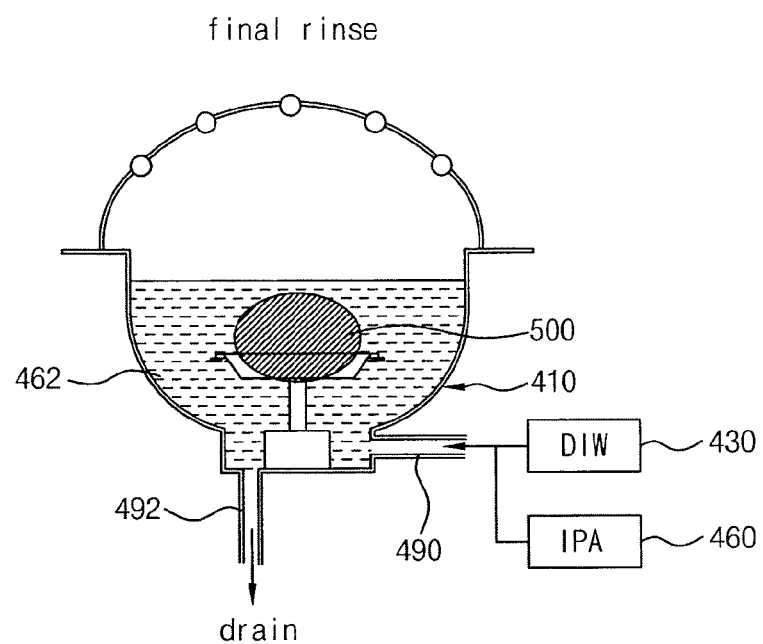

Referring to FIG. 5E, the deionized water and $O_3$ solution 452 is discharged out of the chamber 410 via the drain 492, and the deionized water and organic solvent are then introduced into the chamber 410 from the deionized water supply bath 430 and the organic solvent bath 460, respectively, via the supply port 490 such that the second rinsed semiconductor substrate 500 may be finally rinsed with a mixed solution 462 of deionized water and organic solvent. Any one of IPA, methanol, and ethanol can be used as the organic solvent, although IPA is preferred. When IPA is used, the IPA is maintained at a volume ratio of 1~99% in the mixed solution 462 of deionized water and organic solvent. The mixed solution of deionized water and organic solvent is controlled at a temperature of 23~70° C.

Therefore, the final rinse process is performed using the mixed solution of deionized water and organic solvent, thereby reducing the surface tension of the residual water in the semiconductor substrate.

Figure 5F:
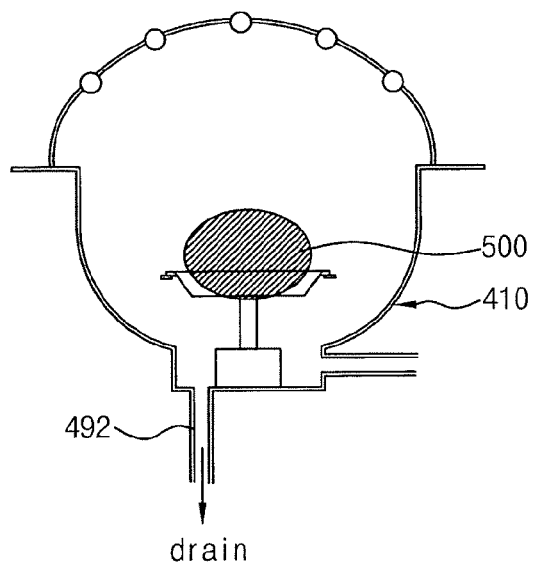

Referring to FIG. 5F, the mixed solution of deionized water and organic solvent is discharged out of the chamber 410 via the drain 492.

Figure 5G:
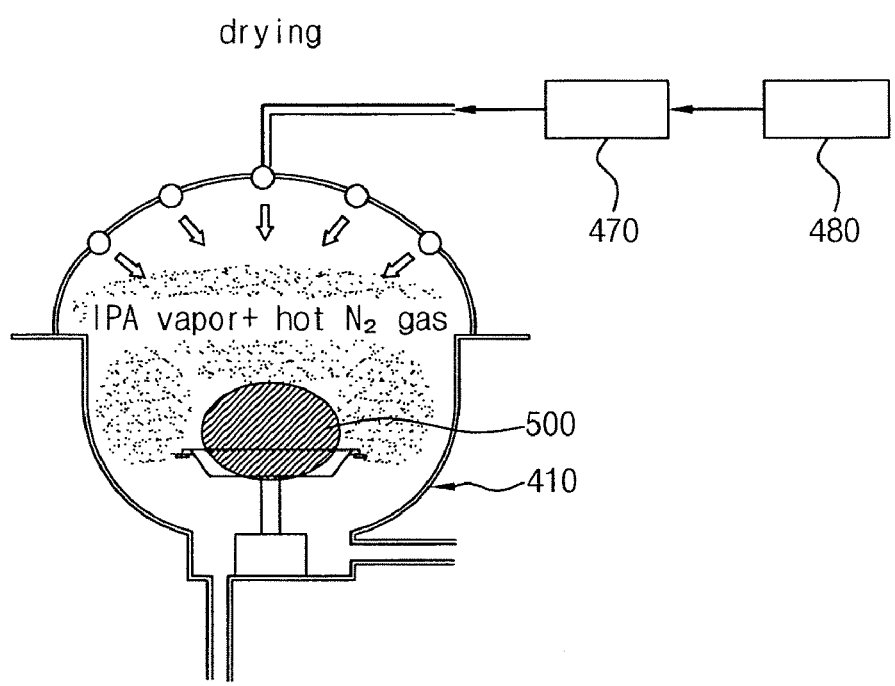

Referring to FIG. 5G, the IPA vapor is introduced into the chamber 410 from the IPA vapor generator 470 via the IPA vapor supply port 494 so that the final rinsed semiconductor substrate may be dried. At this time, the hot $N_2$ gas at a temperature of 50~200° C. is released into the IPA vapor generator 470 from the hot $N_2$ gas supplier 480 and acts as a carrier gas for the IPA vapor, whereby the hot $N_2$ gas is introduced into the chamber 410 together with the IPA vapor. At this time, the mixed gas of IPA vapor and hot $N_2$ gas has IPA vapor contents of 20~90%.

Herein, the present invention can allow the residual water remaining in the substrate to be substituted into the IPA, since larger amounts of IPA vapor flow into the chamber 410 one time in a state such that the surface tension of the residual water in the substrate is minimized.

Further, the present invention can prevent the watermarks forming between the metal storage nodes, and thus prevent cell-to-cell leaning and cell-to-cell bridges caused by the generation of watermarks, since the cleaning process and subsequent rinse and drying processes for removing the mold insulating layer may be performed in in-situ within the same chamber.

As is apparent from the above description, the present invention can allow the cleaning process, rinse process, and drying process for removing the mold insulating layer to be performed in an in-situ manner upon forming the cylindrical storage node, as well as the final rinse process performed with the mixed solution of deionized water and organic solvent such that the subsequent drying process is performed in a state where the surface tension is minimized. Therefore, the present invention prevents the formation of watermarks between the metal storage nodes and thus prevents cell-to-cell leaning and cell-to-cell bridges caused by the generation of watermarks, which results in an improvement in the manufacturing yield of the semiconductor device.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for forming a capacitor comprising steps of:
    forming a mold insulating layer with a plurality of storage node holes over a semiconductor substrate;
    forming a storage node on a surface of each of the storage node holes in the mold insulating layer; and
    removing the mold insulating layer comprising steps of:
    loading the semiconductor substrate with the storage node in the chamber in which a cleaning process, rinse process, and drying process are performed in an in-situ manner;
    removing the mold insulating layer by introducing an etchant into the chamber;
    rinsing the semiconductor substrate with the mold insulating layer being removed by introducing deionized water into the chamber while discharging the etchant out of the chamber;
    finally rinsing the rinsed semiconductor substrate with a mixed solution of deionized water and an organic solvent;
    drying the finally rinsed semiconductor substrate by introducing an iso-propylene alcohol (IPA) vapor into the chamber while discharging the mixed solution of deionized water and organic solvent out of the chamber; and
    unloading the dried semiconductor substrate.

2. The method for forming a capacitor according to claim 1, wherein the storage node made of metal.

3. The method for forming a capacitor according to claim 1, wherein the etchant for removing the mold insulating layer is used with a BOE solution or a diluted HF solution.

4. The method for forming a capacitor according to claim 3, wherein the diluted HF solution has $HF:H_2O$ ratio of 49%:51% with a $HF:H_2O$ volume ratio of 1:1~1:50.

5. The method for forming a capacitor according to claim 1, wherein the rinsing step of the semiconductor substrate comprises steps of:
    first rinsing with only the deionized water introduced into the chamber; and
    second rinsing with the deionized water and $O_3$ by introducing $O_3$ into the chamber.

6. The method for forming a capacitor according to claim 5, wherein the second rinsing step is performed with $O_3$ maintained at a concentration of 5~200 ppm.

7. The method for forming a capacitor according to claim 5, wherein the second rinsing step is performed for 1~10 minutes.

8. The method for forming a capacitor according to claim 1, wherein the final rinsing step is performed using a mixed solution of deionized water and any one of IPA, methanol, and ethanol as the organic solvent.

9. The method for forming a capacitor according to claim 8, wherein the final rinsing step is performed using the mixed solution of the deionized water and the IPA.

10. The method for forming a capacitor according to claim 9, wherein the IPA is contained at a volume ratio of 1~99%.

11. The method for forming a capacitor according to claim 9, wherein the final rinsing step is performed by controlling the temperature of the mixed solution of deionized water and the IPA at 23~70° C.

12. The method for forming a capacitor according to claim 1, wherein the drying step of the semiconductor substrate is performed by introducing into the chamber a hot $N_2$ gas as a carrier gas for the IPA vapor.

13. The method for forming a capacitor according to claim 12, wherein the hot $N_2$ gas has a temperature of 50~200° C.

14. The method for forming a capacitor according to claim 12, wherein the IPA has vapor contents of 20~90% in the mixed gas of the IPA and hot $N_2$ gas.

15. The method for forming a capacitor according to claim 1, wherein the chamber is used with a dHF & Rinsing Dryer (FRD) type dryer that is capable of performing the cleaning process, rinse process, and drying process in an in-situ manner.

16. The method for forming a capacitor according to claim 15, wherein the FRD type dryer comprises:
    a chamber in which all or any combination of the cleaning process, rinse process, and drying process are performed;
    a cover covering the chamber;
    a deionized water supply bath, an etchant supply bath, an $O_3$ generator, and an organic solvent bath, all of which are connected to the chamber for providing the deionized water, etchant, $O_3$ and organic solvent, respectively; and
    an IPA vapor generator connected to the chamber for providing the IPA vapor.

17. The method for forming a capacitor according to claim 16, wherein the IPA vapor generator is connected to an upper portion of the cover.

18. The method for forming a capacitor according to claim 16, wherein the FRD type dryer further comprises a hot $N_2$ gas supplier connected to the IPA vapor generator for providing the hot $N_2$ gas.

19. The method for forming a capacitor according to claim 16, wherein the FRD type dryer further comprises:
    a supply port connected to the lower side portion of the chamber for introducing the deionized water, etchant, $O_3$ and organic solvent into the chamber; and
    a drain connected to the bottom portion of the chamber for discharging the solutions introduced into the chamber out of the chamber.

* * * * *